United States Patent
Lee et al.

(10) Patent No.: US 9,570,168 B2
(45) Date of Patent: Feb. 14, 2017

(54) NONVOLATILE MEMORY DEVICE WITH REDUCED COUPLING NOISE AND DRIVING METHOD THEREOF

(71) Applicant: Samsung Electronics Co., Ltd., Suwon-si, Gyeonggi-do (KR)

(72) Inventors: Jae-Yun Lee, Anyang-si (KR); Woo-Jung Sun, Seoul (KR); Kwang-Jin Lee, Hwaseong-si (KR); Dong-Hoon Jeong, Changwon-si (KR); Beak-Hyung Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/832,229

(22) Filed: Aug. 21, 2015

(65) Prior Publication Data

US 2016/0055905 A1 Feb. 25, 2016

(30) Foreign Application Priority Data

Aug. 22, 2014 (KR) ........................ 10-2014-0109652

(51) Int. Cl.
| | |
|---|---|
| *G11C 7/00* | (2006.01) |
| *G11C 13/00* | (2006.01) |
| *G11C 11/418* | (2006.01) |
| *G11C 11/417* | (2006.01) |
| *G11C 7/10* | (2006.01) |

(52) U.S. Cl.
CPC ........... *G11C 13/004* (2013.01); *G11C 7/1075* (2013.01); *G11C 11/417* (2013.01); *G11C 11/418* (2013.01); *G11C 13/0026* (2013.01); *G11C 13/0038* (2013.01); *G11C 13/0069* (2013.01); *G11C 2207/2209* (2013.01); *G11C 2207/229* (2013.01); *G11C 2207/2281* (2013.01); *G11C 2213/71* (2013.01); *G11C 2213/72* (2013.01)

(58) Field of Classification Search
CPC .. G11C 11/417; G11C 11/418; G11C 11/4074; G11C 11/4091; G11C 7/10; G11C 7/1096; G11C 7/1048; G11C 7/1051
USPC .............. 365/148, 158, 189.16, 222, 230.03, 365/189.07, 189.08, 63, 189.15, 185.13
See application file for complete search history.

(56) References Cited

U.S. PATENT DOCUMENTS

| | | | | |
|---|---|---|---|---|
| 5,793,686 | A | * | 8/1998 | Furutani .............. G11C 7/1051 365/201 |
| 5,953,261 | A | * | 9/1999 | Furutani .............. G11C 7/1051 326/83 |
| 6,307,793 | B1 | | 10/2001 | Murakami |
| 6,735,136 | B2 | | 5/2004 | Lee |

(Continued)

FOREIGN PATENT DOCUMENTS

| | | |
|---|---|---|
| JP | 2012185890 A | 9/2012 |
| KR | 100237050 B1 | 10/1999 |

(Continued)

*Primary Examiner* — Gene Auduong
(74) *Attorney, Agent, or Firm* — Myers Bigel, P.A.

(57) ABSTRACT

Provided are nonvolatile memory devices and a driving method of the nonvolatile memory devices. The nonvolatile memory devices may include a plurality of memory banks, a read global bit line shared by the plurality of memory banks, a write global bit line shared by the plurality of memory banks, a read circuit connected with the read global bit line and performing a read operation, and a discharge control circuit connected with the write global bit line and primarily discharging the write global bit line during an initialization interval after a power-up operation.

20 Claims, 18 Drawing Sheets

(56) References Cited

U.S. PATENT DOCUMENTS

| | | |
|---|---|---|
| 7,151,698 B2 | 12/2006 | Baker |
| 7,190,618 B2 | 3/2007 | Byeon |
| 7,548,457 B2 | 6/2009 | Kang et al. |
| 7,817,489 B2 | 10/2010 | Cho et al. |
| 7,929,337 B2 | 4/2011 | Choi et al. |
| 8,023,320 B2 | 9/2011 | Kim et al. |
| 8,085,575 B2 | 12/2011 | Choi et al. |
| 8,218,354 B2 | 7/2012 | Liaw et al. |
| 8,243,508 B2 | 8/2012 | Choi |
| 8,310,891 B2 | 11/2012 | Kim et al. |
| 8,320,172 B2 | 11/2012 | Castro et al. |
| 8,467,216 B2 | 6/2013 | Kim et al. |
| 2008/0225622 A1* | 9/2008 | Hidaka ............... G11C 11/005 365/230.03 |
| 2009/0316499 A1* | 12/2009 | Hidaka ............... G11C 11/005 365/189.011 |
| 2010/0195415 A1 | 8/2010 | Seko |
| 2012/0039141 A1 | 2/2012 | Ro et al. |
| 2012/0278019 A1 | 11/2012 | Lee et al. |
| 2013/0250645 A1 | 9/2013 | Kim et al. |

FOREIGN PATENT DOCUMENTS

| | | |
|---|---|---|
| KR | 1020010007554 A | 1/2001 |
| KR | 1020030041067 A | 5/2003 |
| KR | 1020050095191 A | 9/2005 |
| KR | 100649831 B1 | 11/2006 |
| KR | 100763353 B1 | 9/2007 |
| KR | 1020080085409 A | 9/2008 |
| KR | 1020090090601 A | 8/2009 |
| KR | 1020100046531 A | 5/2010 |
| KR | 1020110079467 A | 7/2011 |
| KR | 1020110087052 A | 8/2011 |
| KR | 20120049115 A | 5/2012 |

* cited by examiner

NONVOLATILE MEMORY DEVICE WITH REDUCED COUPLING NOISE AND DRIVING METHOD THEREOF

CROSS-REFERENCE TO RELATED APPLICATION

This application claims priority from Korean Patent Application. No 10-2014-0109652 filed on Aug. 22, 2014 in the Korean Intellectual Property Office, and all the benefits accruing therefrom under 35 U.S.C. 119, the disclosure of which is incorporated by reference herein in its entirety.

BACKGROUND

With an increase in size of a memory device, a bit line and a word line connected with a memory cell may have a hierarchical structure. For example, the bit line may include a global bit line and a plurality of local bit lines connected with the global bit line. The word line may include a main word line and a plurality of sub word lines connected with the main word line.

In such a case, a distance between a read circuit and the memory cell or a distance between a write circuit and the memory cell may be significantly increased. Therefore, capacitance of the bit line may also be relatively large. Further, the amount of current required for charging and discharging the bit line may also be relatively large. For example, a memory device in which hundreds of read circuits simultaneously operate may require current of hundreds of milliamps in order to charge a plurality of bit lines for each read operation. The current consumption may deteriorate current performance of a memory and generate power noise.

The global bit line may be divided into a write global bit line and a read global bit line. Herein, coupling noise may be generated in the read global bit line depending on a change in voltage level of the write global bit line.

SUMMARY

The present inventive concepts may provide nonvolatile memory devices with reduced coupling noise.

The present inventive concepts may also provide a driving method of nonvolatile memory devices with reduced coupling noise.

The present inventive concepts are not limited to the aforementioned embodiments, and other embodiments, which are not mentioned above, will be apparent to those skilled in the art from the following description.

According to aspects of the present inventive concepts, there are provided nonvolatile memory devices including a plurality of memory banks, a read global bit line shared by the plurality of memory banks, a write global bit line shared by the plurality of memory banks, a read circuit connected with the read global bit line and performing a read operation, and a discharge control circuit connected with the write global bit line and primarily discharging the write global bit line during an initialization interval after a power-up operation.

According to other aspects of the present inventive concepts, there are provided nonvolatile memory devices including a plurality of memory banks, a read global bit line shared by the plurality of memory banks, a write global bit line shared by the plurality of memory banks, a read circuit connected with the read global bit line, and a discharge control circuit connected with the write global bit line and cyclically discharging the write global bit line.

According to still other aspects of the present inventive concepts, there is provided a driving method of nonvolatile memory devices including increasing a voltage level of a write global bit line shared by a plurality of memory banks during a power-up interval, primarily discharging the write global bit line, inputting a first write command after the primarily discharging operation, and performing a first write operation by using the first write command.

BRIEF DESCRIPTION OF THE DRAWINGS

The above and other features and advantages of the present inventive concepts will become more apparent by describing in detail embodiments thereof with reference to the attached drawings in which.

DETAILED DESCRIPTION OF THE EMBODIMENTS

Figure 1:
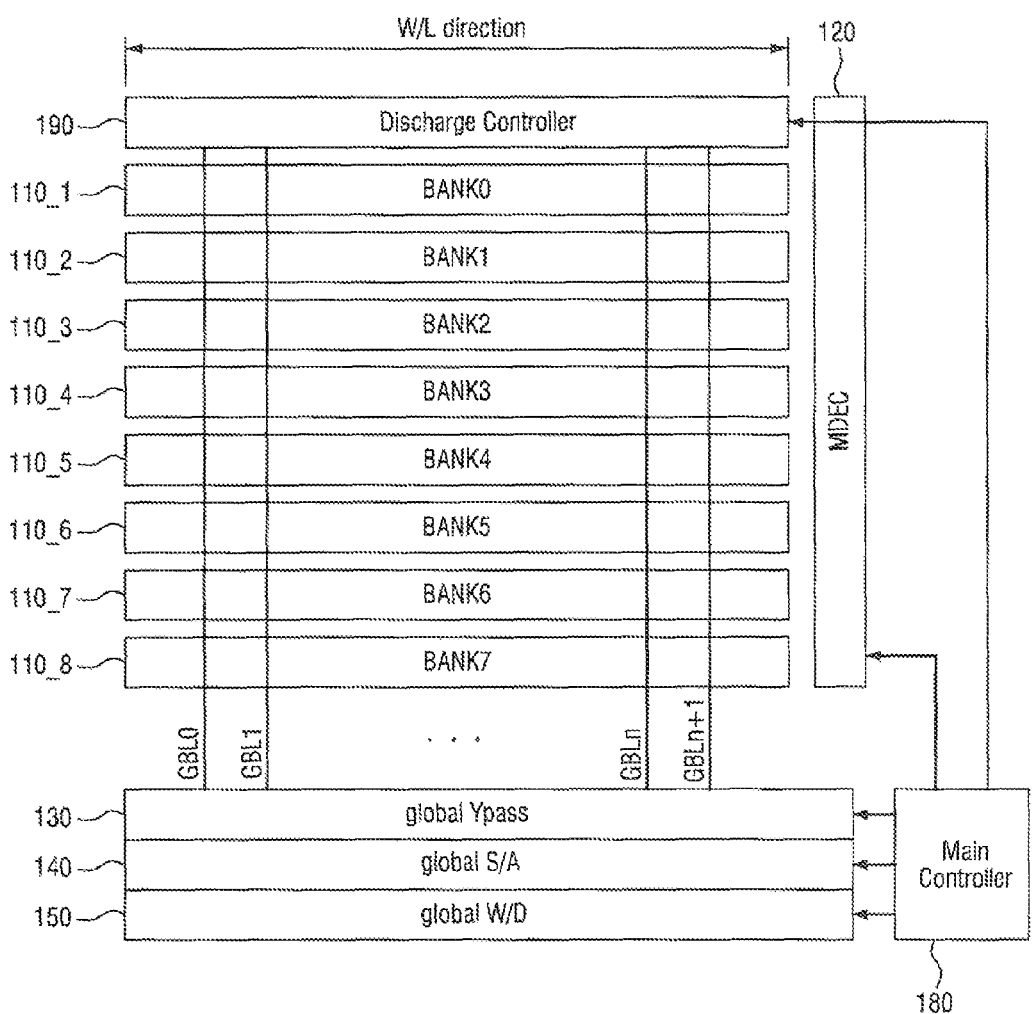
FIG. 1 is a block diagram describing nonvolatile memory devices according to embodiments of the present inventive concepts.

Advantages and features of the present inventive concepts and methods of accomplishing the same may be understood more readily by reference to the following detailed description of preferred embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the present inventive concepts to those skilled in the art, and the present inventive concepts will only be defined by the appended claims. Like reference numerals refer to like elements throughout the specification.

The terminology used herein is for the purpose of describing particular embodiments only and is not intended to be limiting of the present inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath", "below", "lower", "above", "upper", and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Hereinafter, embodiments of the present inventive concepts will be described by using a phase change random access memory (PRAM). However, it will be apparent to those skilled in the art that the present inventive concepts can be applied to all non-volatile memory devices using a resistor, such as a resistive RAM (RRAM) and a magnetic RAM (MRAM). Further, it will be apparent to those skilled in the art that the present inventive concepts can be applied to other memory devices having a hierarchical structure using a global bit line and a local bit line.

FIG. 1 is a block diagram describing nonvolatile memory devices according to some embodiments of the present inventive concepts. In FIG. 1, only eight memory banks are illustrated as an example for ease of description, but the present inventive concepts are not limited thereto.

Referring to FIG. 1, nonvolatile memory devices according to some embodiments of the present inventive concepts may include a plurality of memory banks 110_1 to 110_8, a global column selection circuit 130, a read circuit 140, a write circuit 150, a main word line decoder 120, a discharge control circuit 190, and a main controller 180.

The main controller 180 may provide control signals to the global column selection circuit 130, the read circuit 140, the write circuit 150, the main word line decoder 120, the discharge control circuit 190, and the like in order to control the global column selection circuit 130, the read circuit 140, the write circuit 150, the main word line decoder 120, and the discharge control circuit 190.

Meanwhile, with a high capacity and high integration of nonvolatile memory devices, the nonvolatile memory devices may be implemented in a hierarchical bit line structure using a global bit line and a local bit line, and in a hierarchical word line structure using a main word line and a sub word line. In such a case, in the nonvolatile memory devices according to some embodiments of the present inventive concepts, for example, respective global bit lines GBL0 to GBLn+1 may be arranged to be shared by the plurality of memory banks 110_1 to 110_8. Further, each main word line may be arranged in one memory bank of the plurality of memory banks 110_1 to 110_8.

Figure 2:
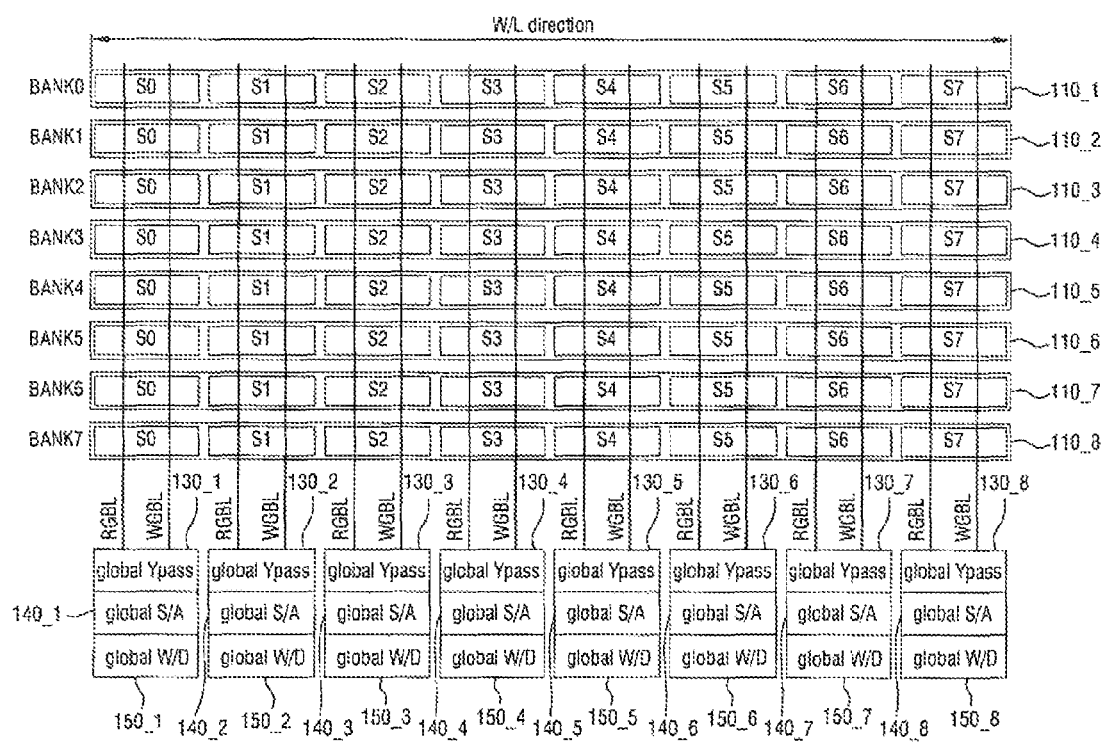
FIG. 2 is a block diagram describing the nonvolatile memory devices illustrated in FIG. 1.

In addition, each of the global bit lines GBL0 to GBLn+1 may include a write global bit line used for a write operation and a read global bit line used for a read operation (see FIG. 2).

Herein, the read circuit 140 may be connected with the plurality of global bit lines GBL0 to GBLn+1 to read data from nonvolatile memory cells positioned in the plurality of memory banks 110_1 to 110_8 through the global bit lines GBL0 to GBLn+1. The write circuit 150 may be connected with the plurality of global bit lines GBL0 to GBLn+1 in order to write data to the nonvolatile memory cells positioned in the plurality of memory banks 110_1 to 110_8 through the global bit lines GBL0 to GBLn+1.

The main word line decoder 120 may be connected with a plurality of main word lines in order to selectively select the plurality of main word lines arranged to correspond to the plurality of memory banks 110_1 to 110_8, respectively. Since the main word line decoder 120 is arranged to be shared by the plurality of memory banks 110_1 to 110_8, an area of a core structure may be decreased.

The discharge control circuit 190 may be connected with the write global bit line in order to discharge the write global bit line if necessary.

For example, before a write command is input, the discharge control circuit 190 may perform the discharge operation during an initialization interval after a power-up operation.

Alternatively, the discharge control circuit 190 may perform the discharge operation even after the write command is input. In this case, the discharge control circuit 190 may perform the discharge operation so as not to overlap a develop interval of the read operation.

Alternatively, the discharge control circuit 190 may discharge the write global bit line at each predetermined cycle.

Alternatively, the discharge control circuit 190 may receive a sensing result of a monitoring circuit that senses a voltage level of the write global bit line. The discharge control circuit 190 may discharge the write global bit line when the voltage level of the write global bit line abnormally increases based on the sensing result.

Alternatively, the discharge control circuit 190 may discharge the write global bit line whenever a preactive command PACT of the read operation is input. Herein, the preactive command PACT may be a command for inputting an upper address of the read operation.

A detailed operation of the discharge control circuit 190 will be described below in detail with reference to FIGS. 7 to 13.

FIG. 2 is a block diagram describing the nonvolatile memory devices illustrated in FIG. 1. For ease of description, the structure of the plurality of memory banks is illustrated in detail.

Referring to FIG. 2, the nonvolatile memory devices according to some embodiments of the present inventive concepts may include a write global bit line WGBL used when data is written into the plurality of memory banks 110_1 to 110_8, and may also include a read global bit line RGBL used when data is read from the plurality of memory banks 110_1 to 110_8. When the nonvolatile memory device includes the write global bit line WGBL and the read global bit line RGBL, the nonvolatile memory device may easily perform the read operation while performing the write operation (that is, a read while write (RWW) operation is available).

In the nonvolatile memory devices according to some embodiments of the present inventive concepts, each of the plurality of memory banks 110_1 to 110_8 may be divided into, for example, a plurality of sub blocks S0 to S7. The read circuit 140 of FIG. 1 may include first to eighth read circuits 140_1 to 140_8 corresponding to the plurality of sub blocks S0 to S7, respectively. The write circuit 150 of FIG. 1 may include first to eighth write circuits 150_1 to 150_8 corresponding to the plurality of sub blocks S0 to S7, respectively. The global column selection circuit 130 of FIG. 1 may include first to eighth global column selection circuits 130_1 to 130_8 corresponding to the plurality of sub blocks S0 to S7, respectively.

Figure 3:
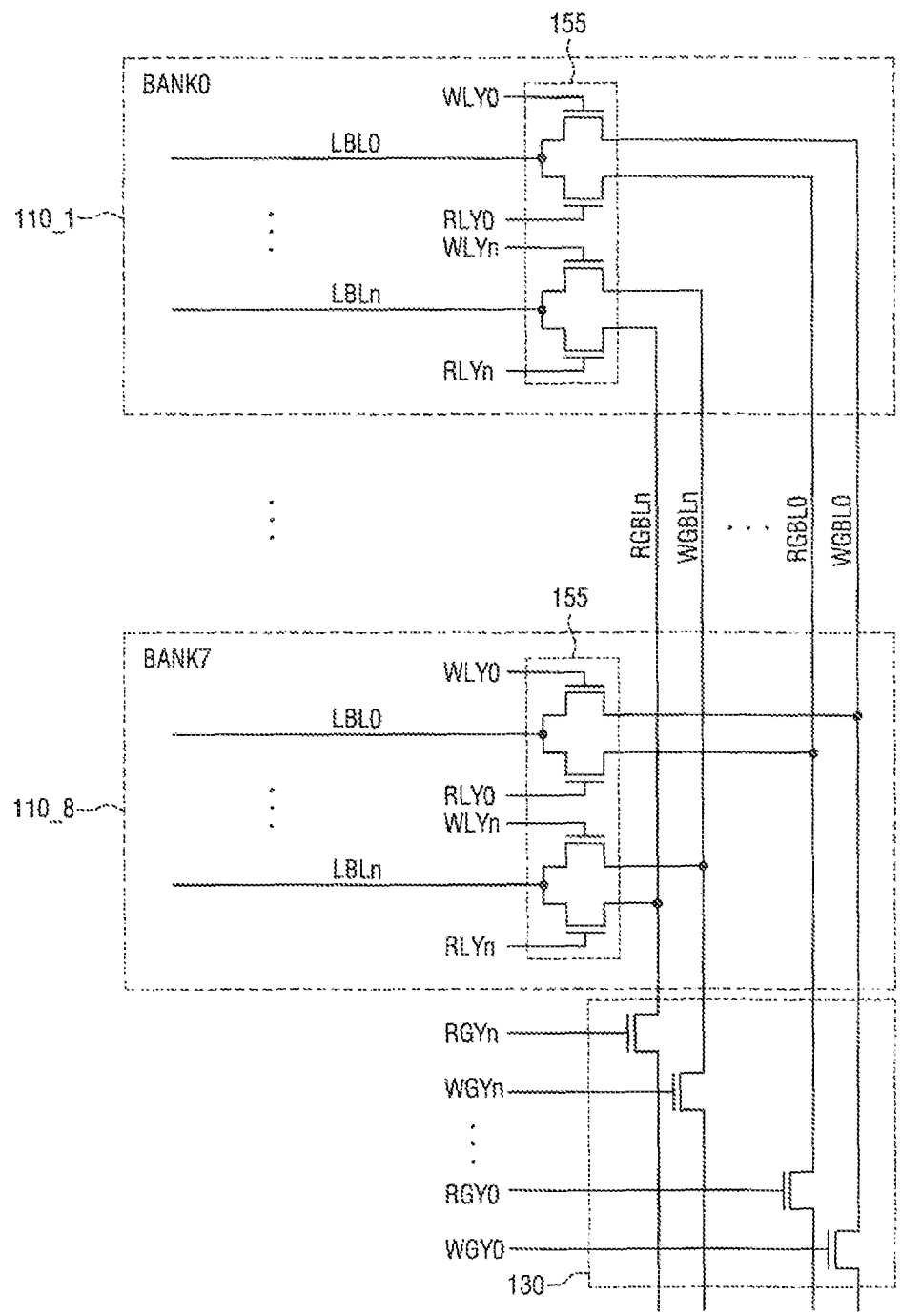
FIG. 3 is a conceptual circuit diagram describing, in more detail, the nonvolatile memory devices of FIG. 2.

FIG. 3 is a conceptual circuit diagram describing, in more detail, the nonvolatile memory devices of FIG. 2.

Referring to FIG. 3, write global bit lines WGBL0 to WGBLn used for the write operation and read global bit lines RGBL0 to RGBLn used for the read operation may be separately provided.

Accordingly, the global column selection circuit 130 may select the write global bit lines WGBL0 to WGBLn in response to write global column selection signals WGY0 to WGYn, and may select the read global bit lines RGBL0 to RGBLn in response to read global selection signals RGY0 to RGYn. Further, the local column selection circuit 155 may selectively connect the local bit lines LBL0 to LBLn and the write global bit lines WGBL0 to WGBLn which correspond to each other in response to write local column selection signals WLY0 to WLYn, and may selectively connect the local bit lines LBL0 to LBLn and the read global bit lines RGBL0 to RGBLn which correspond to each other in response to read local column selection signals RLY0 to RLYn.

Figure 4:
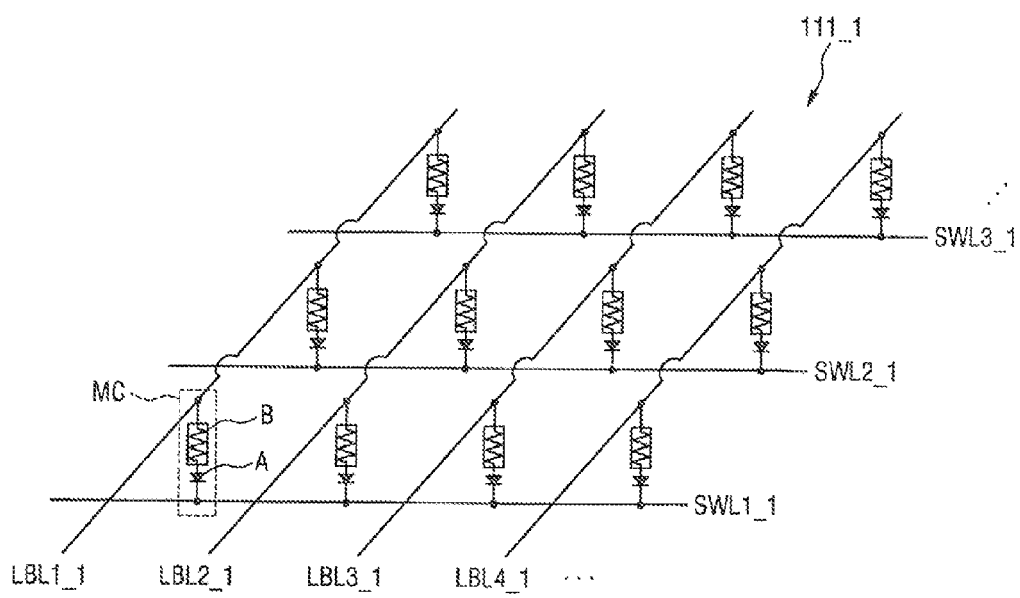
FIGS. 4 and 5 are diagrams describing memory cell arrays of FIG. 1.
Figure 5:
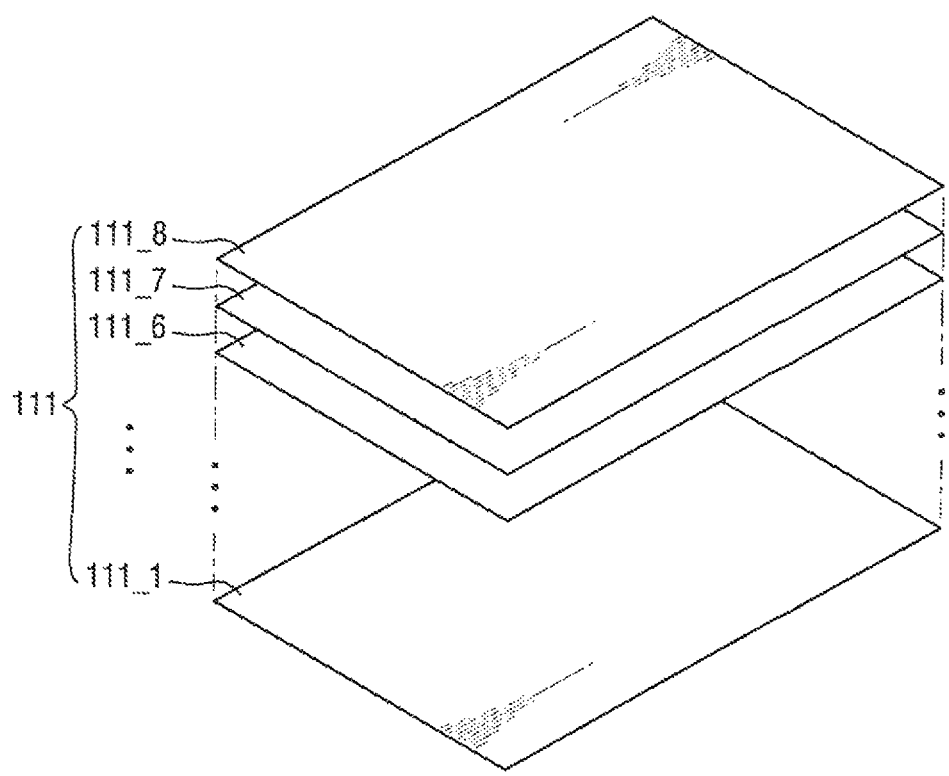

FIGS. 4 and 5 are diagrams describing memory cell arrays of FIG. 1.

First, referring to FIG. 4, memory cell array mays have a cross point structure. The cross point structure means a structure in which one memory cell is formed in an area where one line and another line cross each other. For example, the local bit lines LBL1_1 to LBL4_1 may extend in a first direction, and sub word lines SWL1_1 to SWL3_1 may extend in a second direction in order to cross the local bit lines LBL1_1 to LBL4_1. A resistive memory cell MC may be formed in an area in which the respective local bit lines LBL1_1 to LBL4_1 and the respective sub word lines SWL1_1 to SWL3_1 cross each other.

The resistive memory cell MC may represent a resistive memory cell MC selected for reading among a plurality of resistive memory cells MCs in the memory cell array. Herein, when the resistive memory cell MC is a PRAM, the resistive memory cell MC may include a variable resistance element B including a phase change material and an access element A that controls current flowing through the variable resistance element B. Herein, the access element A may be a diode or a transistor that is connected in series with the variable resistance element B. Further, for the phase change material, various types of materials may be used, for example, such as GaSb, InSb, InSe, Sb2Te3, and GeTe in which two elements are combined, GeSbTe, GaSeTe, InSbTe, SnSb2Te4, and InSbGe in which three elements are combined, AgInSbTe, (GeSn)SbTe, GeSb(SeTe), and Te81Ge15Sb2S2 in which four elements are combined, and the like. Among them, GeSbTe composed of germanium (Ge), antimony (Sb), and tellurium (Te) may be primarily used.

Meanwhile, when the resistive memory cell MC is an RRAM, the variable resistance element B may include, for example, NiO or perovskite. The perovskite may be a composition of manganite ($Pr_{0.7}Ca_{0.3}MnO_3$, $Pr_{0.5}Ca_{0.5}MnO_3$, other PCMO, LCMO, and the like), titanate (STO:Cr), zirconate (SZO:Cr, $Ca_2Nb_2O_7$:Cr, $Ta_2O_5$:Cr), and the like.

Alternatively, the memory cell arrays may have a three dimensional (3D) lamination structure as illustrated in FIG. 5. The 3D lamination structure means a form in which a plurality of memory cell arrays 111_1 to 111_8 is vertically laminated. In FIG. 5, eight memory cell arrays 111_1 to 111_8 are laminated as an example, but the present inventive concepts are not limited thereto. Herein, each of the plurality of memory cell arrays 111_1 to 111_8 may include a plurality of memory cell groups and/or a plurality of redundant memory cell groups. When the memory cell arrays are arranged in the 3D lamination structure, each of the plurality of memory cell arrays 111_1 to 111_8 may have the cross point structure illustrated in FIG. 4.

Figure 6:
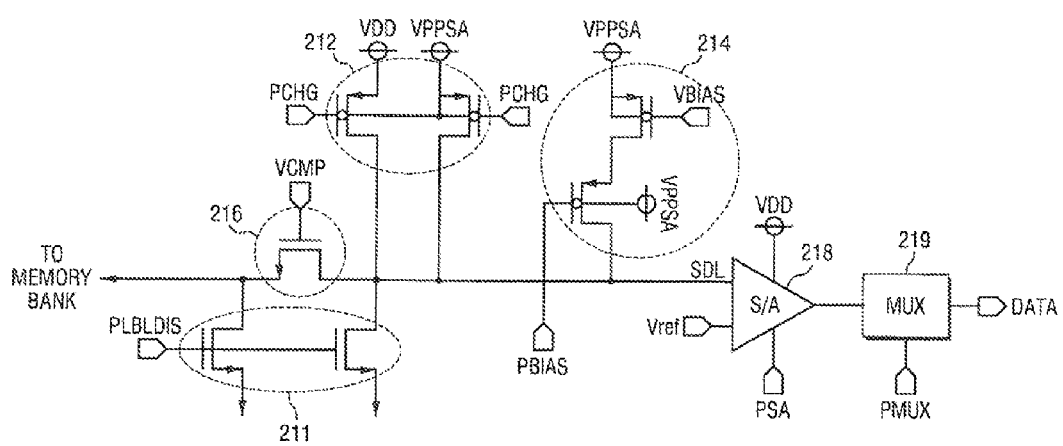
FIG. 6 is a circuit diagram describing a read circuit illustrated in FIG. 1.

FIG. 6 is a circuit diagram describing a read circuit illustrated in FIG. 1. The circuit diagram illustrated in FIG. 3 is just exemplary and the present inventive concepts are not limited thereto.

Referring to FIG. 6, the read circuit 140 may include a discharge unit 211, a precharge unit 212, a compensation unit 214, a clamping unit 216, a sense amplifier 218, and a multiplexer 219, and the like.

The discharge unit 211 may discharge a bit line (that is, a sensing node SDL) electrically connected with the nonvolatile memory cell MC. The discharge unit 211 may include an NMOS transistor controlled by a discharge control signal PLBLDIS.

The precharge unit 212 may precharge the sensing node SDL with a predetermined level, for example, power supply voltage VDD or boosted voltage VPPSA during a precharge period prior to the develop interval. The precharge unit 212 may include a PMOS transistor controlled by a precharge control signal PCHG.

The compensation unit 214 may serve to provide compensation current to the sensing node SDL in order to compensate for reduction of the level of the sensing node SDL, which occurs by current Icell that flows through the selected nonvolatile memory cell MC.

In detail, since a phase change material has small resistance when the nonvolatile memory cell is in a set state, the amount of the penetration current Icell may large. Since the phase change material has large resistance when the nonvolatile memory cell is in a reset state, the amount of the penetration current Icell may be small. When the amount of the compensation current provided by the compensation unit 214 is controlled, the level of the sensing node SDL in the develop interval may be controlled, and a sensing margin may be increased. The compensation unit 214 may include a PMOS transistor controlled by a compensation control signal PBIAS and a PMOS transistor controlled by a voltage signal VBIAS.

The clamping unit 216 may serve to clamp a level of a bit line BL coupled with the selected nonvolatile memory cell within a range appropriate for reading. In detail, the clamping unit 216 may clamp the level to a predetermined level equal to or lower than a threshold voltage Vth of the phase change material. The reason is that when the level of the bit line BL becomes the level of the threshold voltage Vth or higher, a phase of the phase change material of the selected nonvolatile memory cell may be changed. The clamping unit 216 may include an NMOS transistor controlled by a clamping control signal VCMP.

The sense amplifier 218 may compare the level of the sensing node SDL and a reference level Vref and may output a comparison result. The sense amplifier 218 may be a current sense amplifier or a voltage sense amplifier. The sense amplifier 218 may be enabled by a sense amplifier control signal PSA.

The multiplexer 219 may output an output signal of the sense amplifier 218 as data DATA. The multiplexer 219 may be enabled by a multiplexer control signal PMUX.

The operation of the read circuit 140 will be described below in summary. When the read operation starts, the discharge unit 211 may discharge the sensing node SDL. Subsequently, the precharge unit 212 may precharge the sensing node SDL. Then, while the compensation unit 214 provides the compensation current, the develop interval may start. When the develop interval is sufficiently performed, the sense amplifier 218 may compare the level of the sensing node SDL and the reference level Vref and may output the comparison result.

Figure 7:
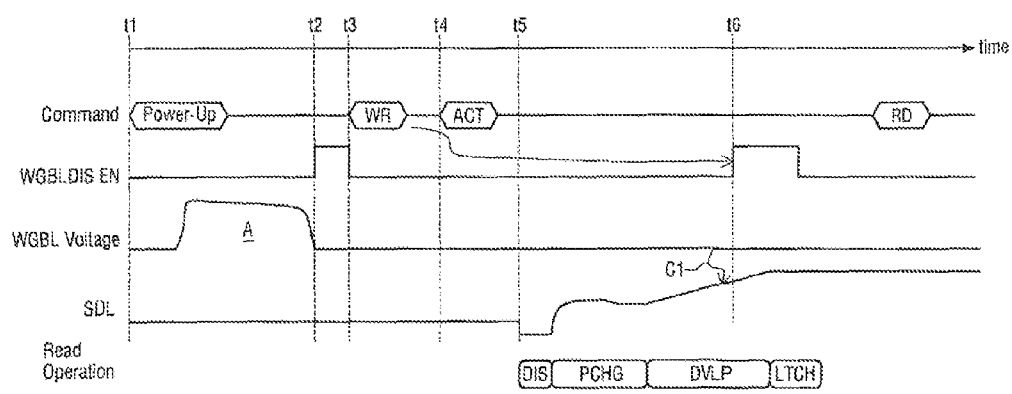
FIG. 7 is a timing diagram describing a driving method of nonvolatile memory devices according to a first embodiment of the present inventive concepts.
Figure 8:
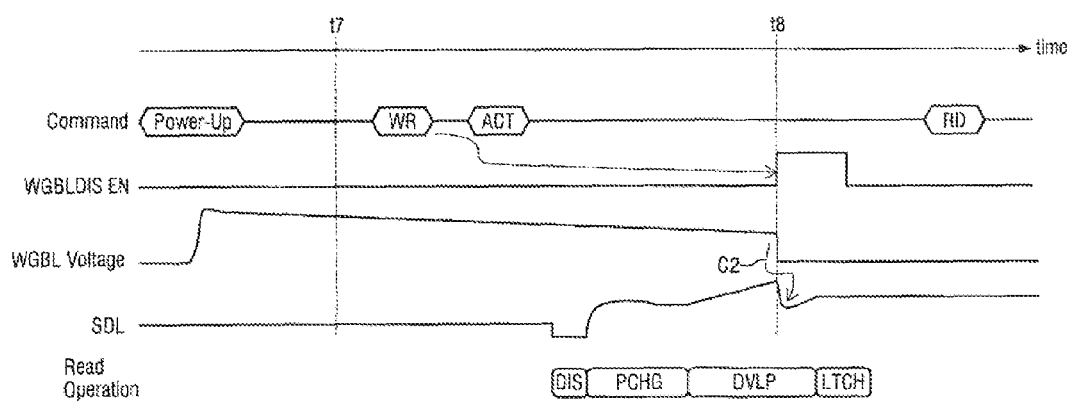
FIG. 8 is a timing diagram describing a case in which a write global bit line is not discharged as compared with FIG. 7.
Figure 9:
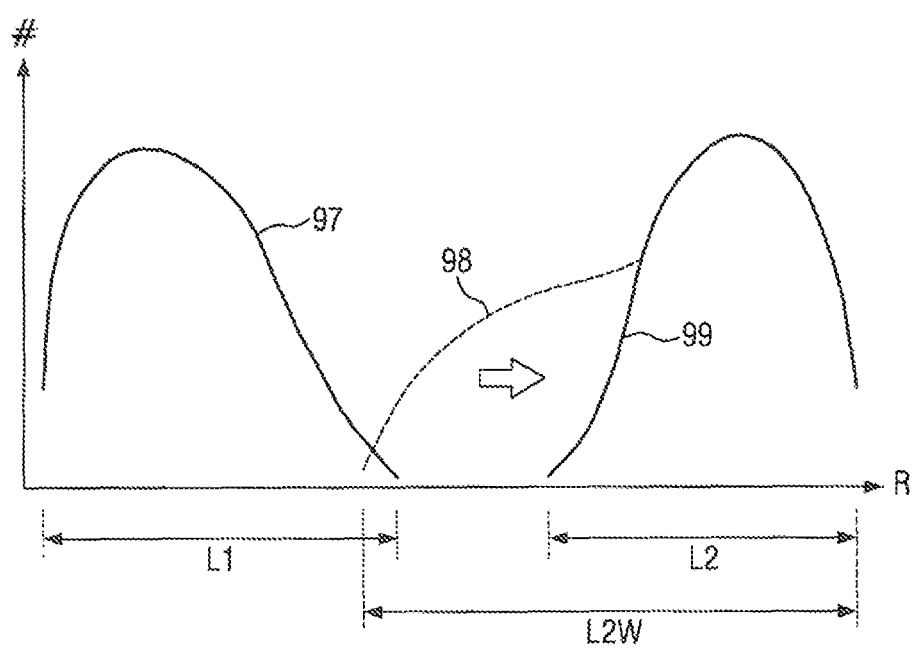
FIG. 9 is a diagram comparing the driving method of FIG. 7 and the driving method of FIG. 8.

FIG. 7 is a timing diagram describing a driving method of a non-volatile memory device according to a first embodiment of the present inventive concepts. FIG. 8 is a timing diagram describing a case in which a write global bit line is not discharged as compared with FIG. 7. FIG. 9 is a diagram comparing the driving method of FIG. 7 and the driving method of FIG. 8.

Referring to FIG. 7, a power-up interval may start at a time t1. That is, a voltage level of power supply voltage Vcc of the nonvolatile memory device may start to increase.

Herein, in order to decrease standby current, when the write operation or the read operation is not performed, the write global bit line WGBL may be in a floating state. However, electric charges may flow into the write global bit line WGBL in the floating state by noise or by leakage current. For example, during the power-up interval, while the voltage level of the power supply voltage Vcc increases, a lot of electric charges may flow into the write global bit line WGBL. As a result, the voltage level of the write global bit line WGBL may be abnormally high (see A of FIG. 7).

At a time t2, a discharge enable signal WGBLDIS_EN may be enabled. For example, the voltage level of the write global bit line WGBL may be decreased to a ground voltage. That is, electric charges accumulated in the write global bit line WGBL may be removed.

At a time t3, a write command WR may be input into the nonvolatile memory device. The nonvolatile memory device may start various preparations including generation of high voltage VPP, and the like for the write operation.

At a time t4, an active command ACT may be input into the nonvolatile memory device. Although not illustrated in FIGS. 7 and 8, the preactive command PACT may be input earlier than the active command ACT. For example, the preactive command PACT may be a command that is input together with the upper address, and the active command ACT may be a command that is input together with a lower address.

After the active command ACT is input, the read operation may start from a time t5. As described by using FIG. 6, the read operation may sequentially include a discharge interval DIS, a precharge interval PCHG, a develop interval DVLP, a latch interval LTCH, and the like.

Herein, the write operation corresponding to the write command WR may be performed in any one memory bank among the plurality of memory banks, and the read operation corresponding to the active command ACT may be performed in another memory bank of the plurality of memory banks. That is, the read operation may be a read while write (RWW) operation.

At a time t6, the discharge enable signal WGBLDIS_EN may be enabled based on the write command WR. The write global bit line WGBL may be discharged before entering a program interval of the write operation (that is, an interval in which write current corresponding to write data WDATA is provided to the write global bit line).

The write global bit line WGBL has already been discharged (that is, see the time t2). Accordingly, although the write global bit line WGBL is discharged, the write global bit line WGBL may not much influence the adjacent read global bit line RGBL. As a result, the voltage level of the sensing node SDL may not also swing (see reference numeral C1).

On the contrary, referring to FIG. 8, a case in which a separate discharge operation is not performed after the power-up interval is reviewed (see time t7). Since the separate discharge operation is not performed, electric charges may flow into the write global bit line WGBL in the floating state before performing the discharge operation at a time t8.

At the time t8, the discharge enable signal WGBLD-IS_EN may be enabled to perform the discharge operation. At the moment of discharging the write global bit line WGBL, the voltage level of the write global bit line WGBL may be significantly changed. That is, coupling noise may be generated. Accordingly, the coupling noise may exert a large influence on the adjacent read global bit line RGBL. As a result, the voltage level of the sensing node SDL may also swing (see reference numeral C2).

Referring to FIG. 9, in nonvolatile memory devices of the present inventive concepts, set data SET and reset data RST may correspond to first and second resistance levels L1 and L2, respectively. The second resistance level L2 may be higher than the first resistance level L1.

Herein, as illustrated in FIG. 8, when the write global bit line WGBL is not previously discharged after the power-up interval, the second resistance level L2 W corresponding to the reset data RST may be very wide. That is, a distribution 98 corresponding to the reset data RST may overlap a distribution 97 corresponding to the set data SET. That is, a read error may occur due to the coupling noise.

On the contrary, as illustrated in FIG. 7, when the write global bit line WGBL is discharged after the power-up interval, a distribution 99 corresponding to the reset data RST may not overlap a distribution 97 corresponding to the set data SET. That is, the read error may not occur due to the coupling noise.

When the discharge operation is performed as described above, a sensing time, a sensing margin, a program time, and like may be consistently managed regardless of an initial voltage of the global bit line GBL or the local bit line LBL.

Figure 10:
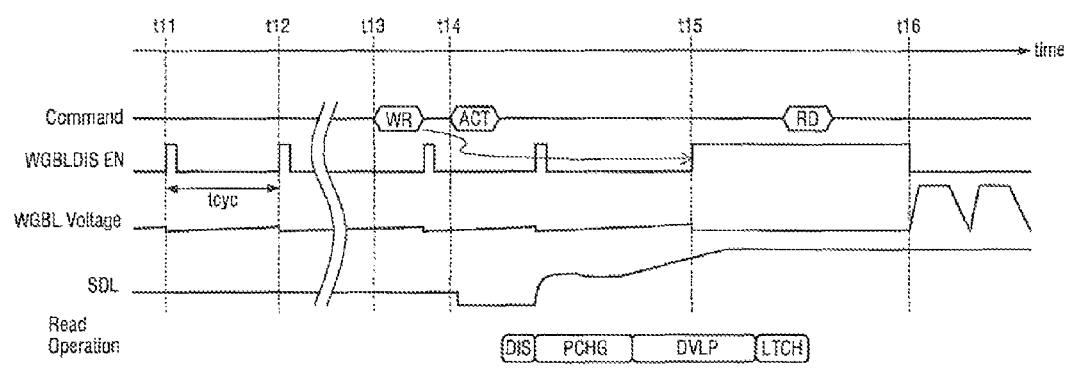
FIG. 10 is a timing diagram describing a driving method of nonvolatile memory devices according to a second embodiment of the present inventive concepts.

FIG. 10 is a timing diagram describing a driving method of nonvolatile memory devices according to a second embodiment of the present inventive concepts. For ease of description, contents which are the same as the contents described by using FIGS. 7 to 9 will be omitted.

Referring to FIG. 10, in the non-volatile memory devices according to the second embodiment of the present inventive concepts, the write global bit line WGBL may be discharged at each predetermined cycle.

That is, a time t11, the discharge enable signal WGBL-DIS_EN may be enabled. Subsequently, at a time t12, the discharge enable signal WGBLDIS_EN may be enabled again. An interval between the time t11 and the time t12 may be a cycle tcyc. The cycle may be a changeable value. When the write global bit line WGBL is cyclically discharged, accumulated electric charges may be cyclically removed in the write global bit line WGBL in the floating state. The cycle may be measured by a timer.

At a time t13, the write command WR may be input.

At a time t14, the active command ACT for the read operation may be input. The read operation may sequentially include the discharge interval DIS, the precharge interval PCHG, the develop interval DVLP, the latch interval LTCH, and the like.

At a time t15, the discharge operation may be performed based on the write command. As described above, the write global bit line WGBL may be cyclically discharged to remove the accumulated electric charges. Accordingly, although the write global bit line WGBL is discharged, the write global bit line WGBL may not much influence the adjacent read global bit line RGBL. As a result, the voltage level of the sensing node SDL may not also swing.

At a time t16, the program interval of the write operation may start. That is, write current corresponding to write data WDATA may be provided to the write global bit line WGBL.

Figure 11:
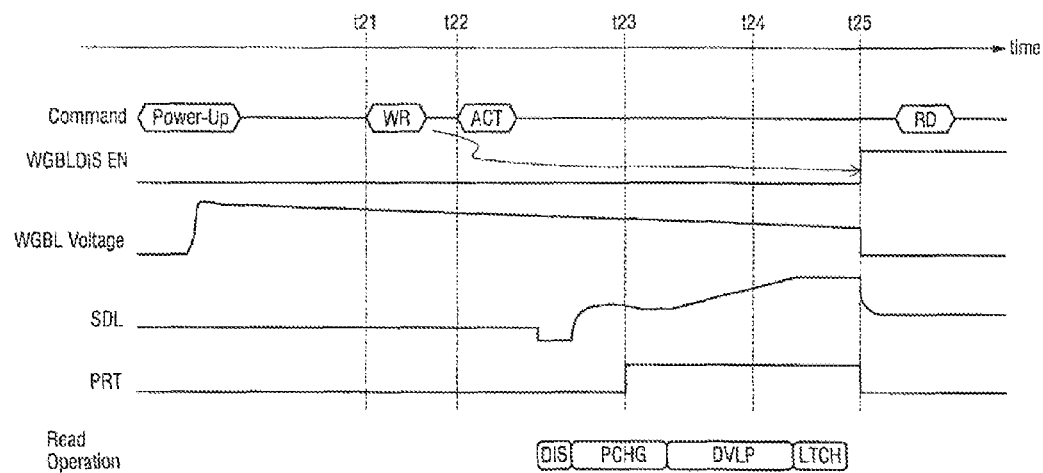
FIG. 11 is a timing diagram describing a driving method of nonvolatile memory devices according to a third embodiment of the present inventive concepts.

FIG. 11 is a timing diagram describing a driving method of nonvolatile memory devices according to a third embodiment of the present inventive concepts. For ease of description, contents which are the same as the contents described by using FIGS. 7 to 9 will be omitted.

Referring to FIG. 11, the write command may be input at a time t21.

The active command may be input at a time t22.

A protection signal PRT may be generated at a time t23. The protection signal may be a signal enabled during a protection interval corresponding to the develop interval DVLP of the read operation. Herein, the protection interval may be the same as the develop interval DVLP, or may be a little larger than the develop interval DVLP while including the develop interval DVLP. In FIG. 11, the protection interval may include a part of the precharge interval PCHG, the entirety of the develop interval DVLP, and a part of the latch interval LTCH.

Meanwhile, a time t24 may be a time when the write global bit line WGBL is discharged based on the write command. However, while the protection signal PRT is enabled, the discharge operation may not be performed.

At a time t25, after the protection signal PRT is disabled, the write global bit line WGBL may be discharged.

That is, in order to prevent noise which may occur due to coupling of the write global bit line WGBL and the read global bit line RGBL, the discharge operation of the write global bit line WGBL, may be performed so as not to overlap with the develop interval of the read operation. To this end, although the protection signal is exemplarily used in FIG. 11, the present inventive concepts are not limited thereto.

Figure 12:
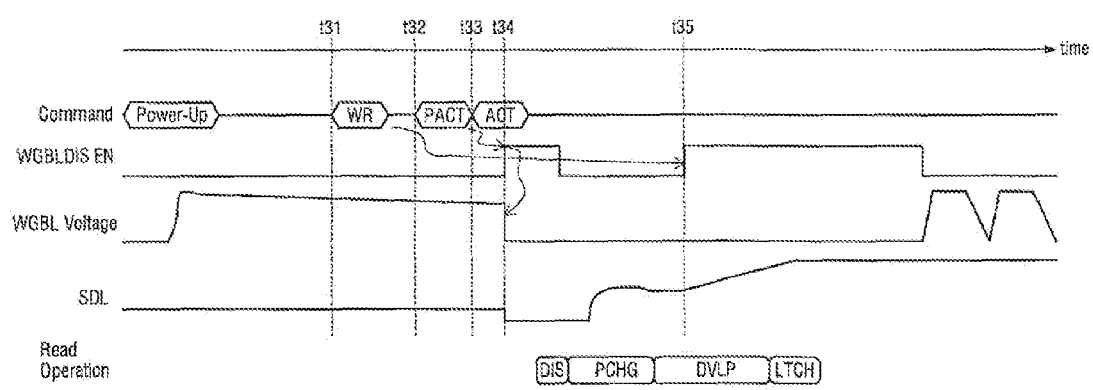
FIG. 12 is a timing diagram describing a driving method of nonvolatile memory devices according to a fourth embodiment of the present inventive concepts.

FIG. 12 is a timing diagram describing a driving method of nonvolatile memory devices according to a fourth embodiment of the present inventive concepts. For ease of description, contents which are the same as the contents described by using FIGS. 7 to 9 will be omitted.

Referring to FIG. 12, the write command may be input at a time t31.

The preactive command may be input at a time t32. The preactive command may be a command which is input together with the upper address.

The active command may be input at a time t33. The active command may be a command which is input together with the lower address.

At a time t34, the write global bit line WGBL may be discharged based on the preactive command.

However, the write global bit line WGBL may not be discharged based on the active command.

At a time t35, the write global bit line WGBL may be discharged based on the write command. Herein, the discharge interval may be overlapped with the develop interval DVLP of the read operation. However, since the write global bit line WGBL is discharged when the preactive command is input, the coupling noise may be decreased even though the discharge interval and the develop interval DVLP are overlapped with each other.

Figure 13:
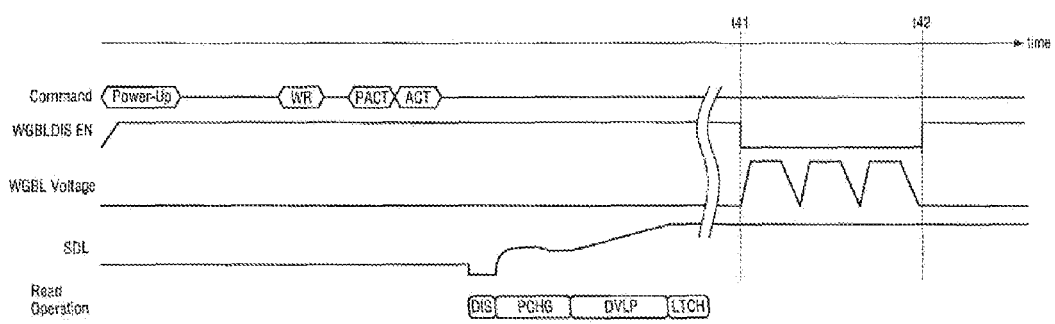
FIG. 13 is a timing diagram describing a driving method of nonvolatile memory devices according to a fifth embodiment of the present inventive concepts.

FIG. 13 is a timing diagram describing a driving method of nonvolatile memory devices according to a fifth embodiment of the present inventive concepts.

Referring to FIG. 13, when the write operation (in more detail, the program interval of the write operation) is not performed, the write global bit line WGBL may be continuously maintained in a discharged state. That is, write current corresponding to the write data WDATA may be provided to the write global bit line WGBL between a time t41 and a time t42. At other times, the write global bit line WGBL may be maintained in the discharged state (for example, the ground voltage).

Although not described by using FIG. 13, a separate monitoring circuit may be provided for the discharge operation. That is, the monitoring circuit may sense the voltage level of the write global bit line WGBL. The discharge control circuit may discharge the write global bit line when the voltage level of the write global bit line WGBL abnormally increases, based on the sensing result of the monitoring circuit.

With reference to FIGS. 7 to 13, the case in which the write global bit line WGBL is discharged during the initialization interval after the power-up operation (see FIG. 7), the case in which the write global bit line WGBL is cyclically discharged (see FIG. 10), the case in which the discharging is performed by avoiding the develop interval of the read operation by using the protection signal (see FIG. 11), the case in which the write global bit line WGBL is discharged whenever the preactive command is input (see FIG. 12), the case in which the write global bit line WGBL is statically maintained in the discharge state (see FIG. 13), the case in which the monitoring circuit is used, and the like have been described.

The aforementioned cases may be combined and used. For example, the write global bit line WGBL may be discharged during the initialization interval after the power-up operation and thereafter, cyclically discharged. Further, the write global bit line WGBL may be discharged during the initialization interval after the power-up operation, and the protection signal may be used. In addition, the write global bit line WGBL may be discharged during the initialization interval after the power-up operation, and the write global bit line WGBL may be discharged whenever the preactive command is input. Alternatively, the write global bit line WGBL may be discharged whenever the preactive command is input while using the protection signal. The cyclical discharge operation may be performed. However, while the protection signal is enabled, the cyclical discharge operation may not be performed. Various other combinations may be achieved.

FIGS. 14 to 18 are diagrams describing memory systems according to some embodiments of the present inventive concepts. Herein, FIGS. 14 to 18 relate to memory systems using the nonvolatile memory device according to some embodiments of the present inventive concepts.

Figure 14:
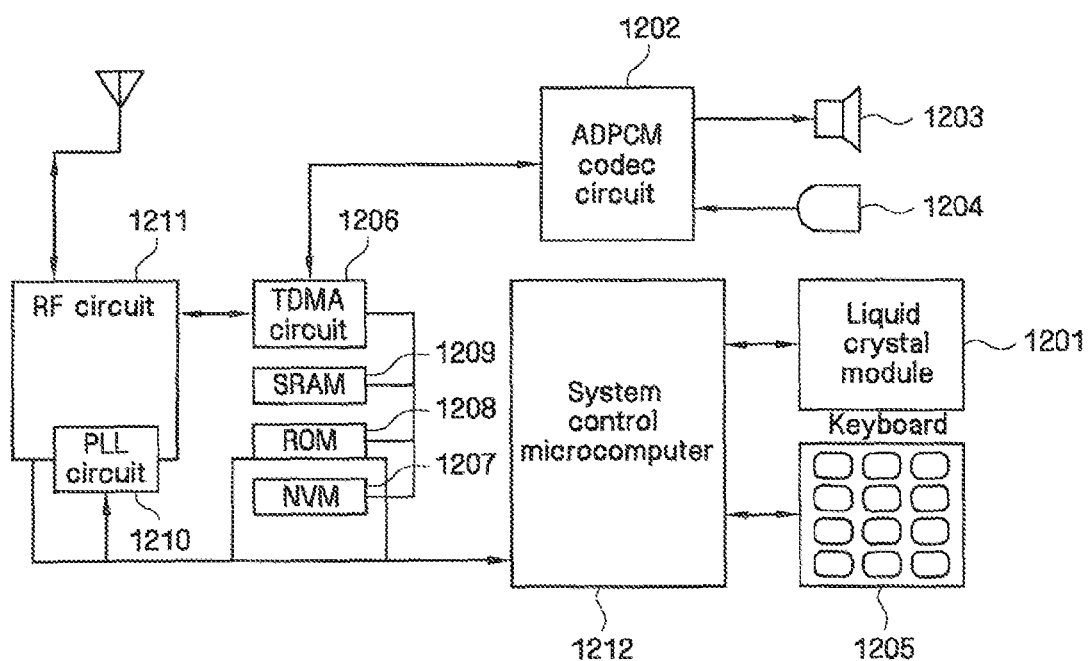
FIGS. 14 to 18 are diagrams describing memory systems according to some embodiments of the present inventive concepts.

FIG. 14 is an exemplary diagram of cellular phone systems in which nonvolatile memory devices according to some embodiments of the present inventive concepts are used.

Referring to FIG. 14, the cellular phone systems may include an adaptive differential pulse code modulation (AD-PCM) codec circuit 1202 for compressing sound or decompressing the compressed sound, a speaker 1203, a microphone 1204, a time division multiple access (TDMA) circuit 1206 for time-divisionally multiplexing digital data, a phase-locked loop (PLL) circuit 1210 for setting a carrier frequency of a radio signal, a radio frequency (RF) circuit 1211 for transferring or receiving the radio signal, and the like.

The cellular phone system may include various types of memory devices. The cellular system may include, for example, a nonvolatile memory device 1207, a ROM 1208, and an SRAM 1209. The nonvolatile memory device 1207 according to some embodiments of the present inventive concepts may be used and may store, for example, an ID number. The ROM 1208 may store a program, and the SRAM 1209 may serve as a task area for a system control microcomputer 1212 or may temporarily store data. Herein, the system control microcomputer 1212 as a processor may control a write operation and a read operation of the nonvolatile memory device 1207.

Figure 15:
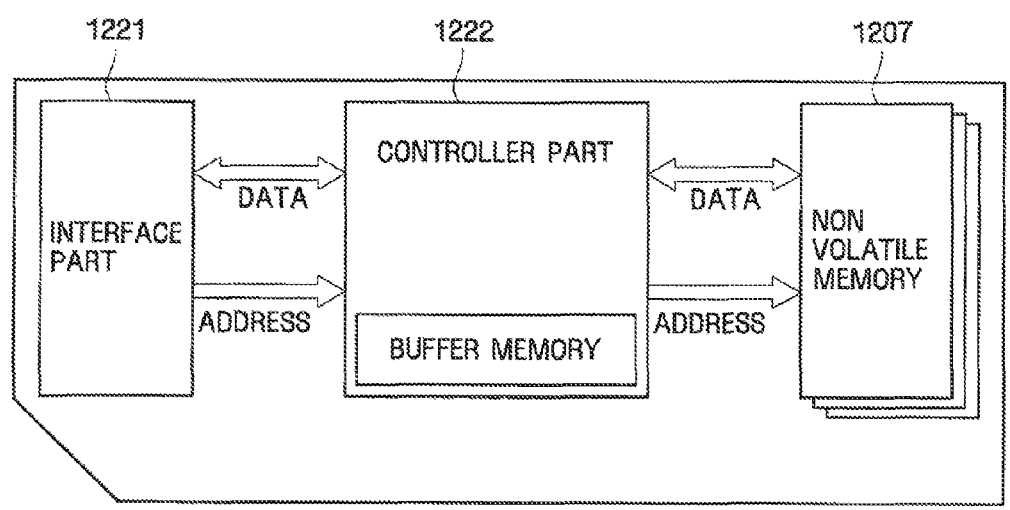

FIG. 15 is an exemplary diagram of a memory card in which the nonvolatile memory device according to some embodiments of the present inventive concepts are used. The memory card may be, for example, a MultiMediaCard (MMC), a secure digital (SD) card, a multiuse card, a micro SD card, a memory stick, a compact SD card, an ID card, a Personal Computer Memory Card International Association (PCMCIA) card, a solid state drive (SSD) card, a chip card, a smart card, a universal serial bus (USB) card, and the like.

Referring to FIG. 15, the memory card may include at least one interface part 1221 that interfaces with the outside, a controller part 1222 that has a buffer memory and controls an operation of the memory card, and a nonvolatile memory device 1207 according to some embodiments of the present inventive concepts. The controller part 1222 as a processor may control a write operation and a read operation of the nonvolatile memory device 1207. In detail, the controller part 1222 may be coupled with the nonvolatile memory device 1207 and the interface part 1221 through a data bus DATA and an address bus ADDRESS.

Figure 16:
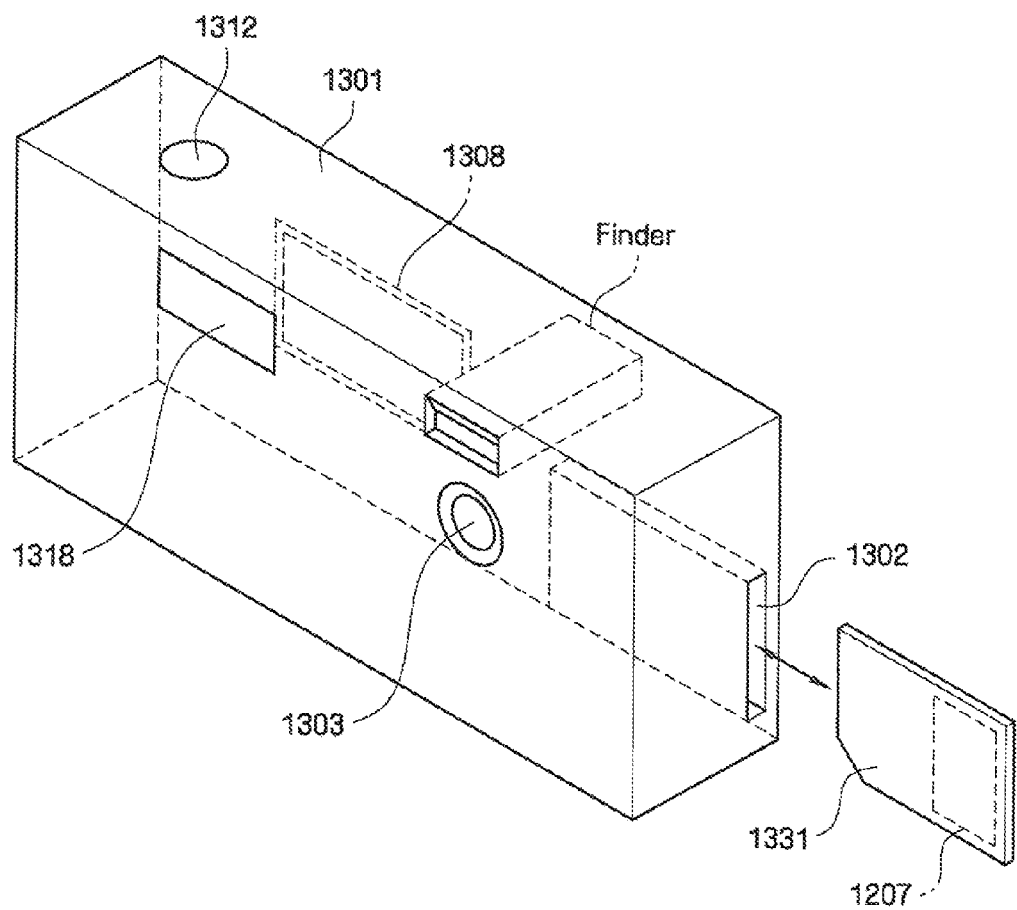

FIG. 16 is an exemplary diagram of a digital still camera in which the nonvolatile memory devices according to some embodiments of the present inventive concepts are used.

Referring to FIG. 16, the digital still camera may include a body 1301, a slot 1302, a lens 1303, a display unit 1308, a shutter button 1312, a strobe 1318, and the like. In particular, the memory card 1331 may be inserted into the slot 1308, and the memory card 1331 may include at least one of the nonvolatile memory devices 1207 according to some embodiments of the present inventive concepts.

In case that the memory card 1331 is a contact type, when the memory card 1331 is inserted into the slot 1308, the memory card 1331 and a specific electric circuit on a circuit board may electrically contact each other. In the case that the memory card 1331 is a non-contact type, the memory card 1331 may communicate with the memory card 1331 through a radio signal.

Figure 17:
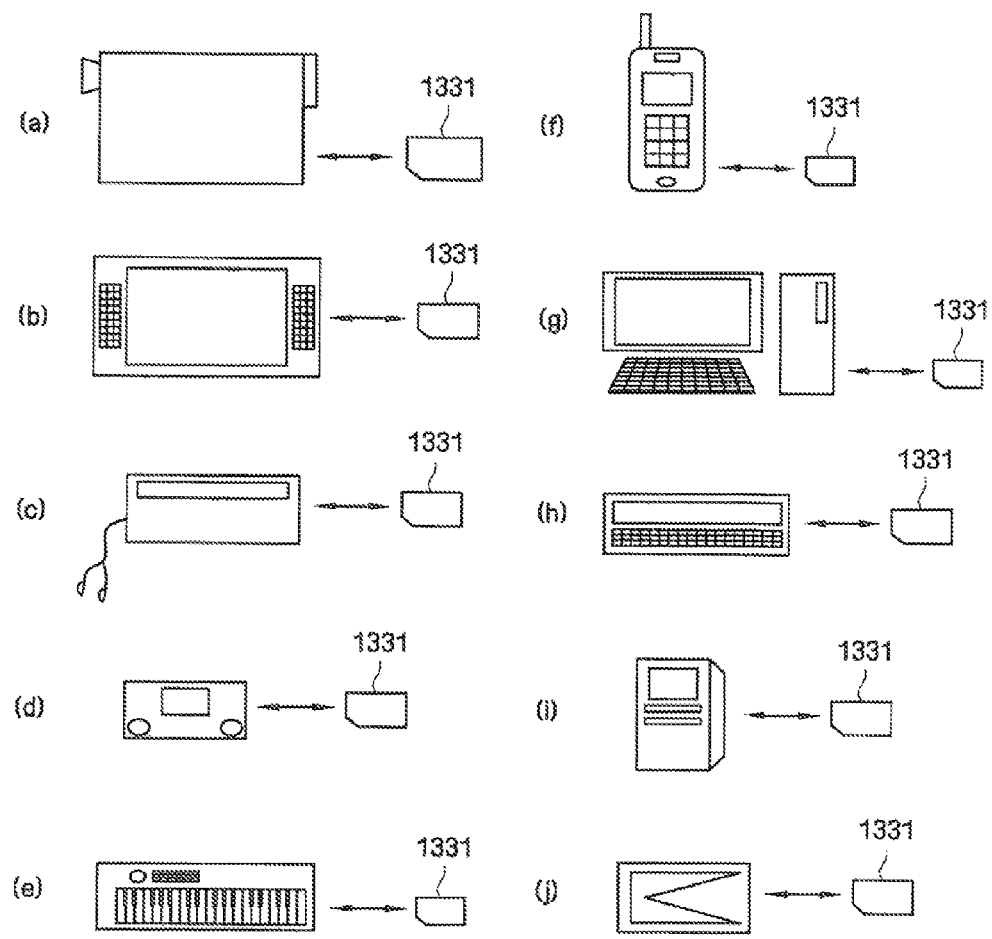

FIG. 17 is an exemplary diagram describing various systems in which the memory card of FIG. 15 is used.

Referring to FIG. 17, the memory card 331 may be used in (a) a video camera, (b) a television, (c) an audio device, (d) a game device, (e) an electronic music device, (f) a cellular phone, (g) a computer, (h) a personal digital assistant (PDA), (i) a voice recorder, (j) a PC card, and the like.

Figure 18:
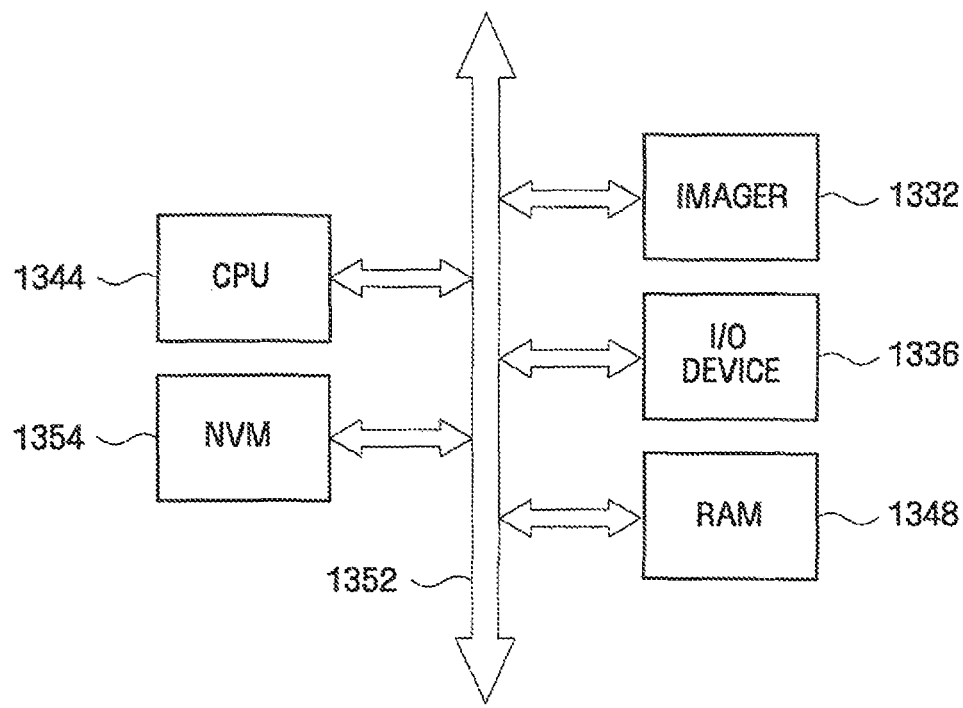

FIG. 18 is an exemplary diagram of an image sensor system in which the nonvolatile memory devices according to some embodiments of the present inventive concepts are used.

Referring to FIG. 18, the image sensor system may include an image sensor 1332, an input/output device 1336, a RAM 1348, a CPU 1344, a nonvolatile memory device 1354 according to some embodiments of the present inventive concepts, and the like. The image sensor 1332, the input/output device 1336, the RAM 1348, the CPU 1344, and the nonvolatile memory device 1354 may communicate with each other through a bus 1352. The image sensor 1332 may include photo sensing elements such as a photo gate, a photo diode, and the like. The image sensor 1332, the input/output device 1336, the RAM 1348, the CPU 1344, and the nonvolatile memory device 1354 may be configured as one chip together with the processor, or may be configured by respective chips separated from the processor.

The foregoing is illustrative of the present inventive concepts and is not to be construed as limiting thereof. Although a few embodiments of the present inventive concepts have been described, those skilled in the art will readily appreciate that many modifications are possible in the embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of the present inventive concepts and is not to be construed as limited to the specific embodiments disclosed, and that modifications to the disclosed embodiments, as well as other embodiments, are intended to be included within the scope of the appended claims. The present inventive concepts are defined by the following claims, with equivalents of the claims to be included therein.

What is claimed is:

1. A nonvolatile memory device comprising:
a plurality of memory banks;
a read global bit line shared by the plurality of memory banks;
a write global bit line, separate from the read global bit line, shared by the plurality of memory banks;
a read circuit connected with the read global bit line and configured to perform a read operation; and
a discharge control circuit connected with the write global bit line and configured to primarily discharge a charge of the write global bit line during an initialization interval after a power-up operation.

2. The nonvolatile memory device of claim 1, wherein the discharge control circuit is configured to primarily discharge the write global bit line before a write command is input.

3. The nonvolatile memory device of claim 1, wherein the read operation is a read while write (RWW) operation such that the read circuit is configured to perform the read operation while a write operation is being performed.

4. The nonvolatile memory device of claim 1, wherein the discharge control circuit is configured to secondarily discharge the write global bit line after a write command is input, said secondarily discharging not overlapping a develop interval of the read operation.

5. The nonvolatile memory device of claim 4, wherein the discharge control circuit is configured to not secondarily discharge the write global bit line while a protection signal is enabled, and
the protection signal is enabled during a protection interval corresponding to the develop interval of the read operation.

6. The nonvolatile memory device of claim 1, wherein the discharge control circuit is configured to secondarily discharge the write global bit line at a predetermined cycle.

7. The nonvolatile memory device of claim 6, wherein the predetermined cycle is measured by a timer.

8. The nonvolatile memory device of claim 1, further comprising a monitoring circuit configured to sense a voltage level of the write global bit line,
wherein the discharge control circuit is configured to secondarily discharge the write global bit line when the voltage level of the write global bit line is determined to abnormally increase, based on a sensing result of the monitoring circuit.

9. The nonvolatile memory device of claim 1, wherein the discharge control circuit is configured to secondarily discharge the write global bit line whenever a preactive command of the read operation is input, the preactive command being a command that is input together with an upper address of the read operation.

10. The nonvolatile memory device of claim 9, wherein the discharge control circuit is configured to not discharge the write global bit line when an active command of the read operation is input, the active command being a command that is input together with a lower address of the read operation.

11. The nonvolatile memory device of claim 1, wherein each of the plurality of memory banks includes a plurality of nonvolatile memory cells using resistors.

12. A nonvolatile memory device comprising:
a plurality of memory banks;
a plurality of read global bit lines shared by the plurality of memory banks;
a plurality of write global bit lines shared by the plurality of memory banks, wherein each read global bit line of the plurality of read global bit lines and write global bit line of the plurality of write global bit lines that share a corresponding one of the plurality of memory banks are separate from one another;
a read circuit connected with the plurality of read global bit lines and configured to read data from memory cells in the plurality of memory banks through the plurality of read global bit lines;
a discharge control circuit connected with the plurality of write global bit lines and configured to cyclically discharge charges of the plurality of write global bit lines;
a column selection circuit configured to select one among the plurality of write global bit lines in response to a write global column selection signal and configured to select one among the plurality of read global bit lines in response to a read global selection signal;
a write circuit connected with the plurality of write global bit lines and configured to write data to the memory cells in the plurality of memory banks through the plurality of write global bit lines; and
a controller configured to control the read circuit, the discharge control circuit, the column selection circuit and the write circuit.

13. The nonvolatile memory device of claim 12, wherein the read circuit is configured to perform a read while write (RWW) operation such that the read circuit is configured to perform the read operation while the write circuit is performing a write operation.

14. The nonvolatile memory device of claim 13, wherein the discharge control circuit is configured to not cyclically discharge the plurality of write global bit lines during a develop interval of the RWW operation.

15. The nonvolatile memory device of claim 14, wherein the discharge control circuit is configured to not cyclically discharge the plurality of write global bit lines while a protection signal is enabled, and the protection signal is enabled during a protection interval corresponding to the develop interval of the RWW operation.

16. The nonvolatile memory device of claim 12, wherein the discharge control circuit is configured to not cyclically discharge the plurality of write global bit lines during a program interval of a write operation.

17. The nonvolatile memory device of claim 12, wherein electric charges are cyclically removed in the plurality of write global bit lines in a floating state when the plurality of write global bit lines are cyclically discharged.

18. A memory card comprising:
a card controller configured to control an operation of the memory card; and
a nonvolatile memory coupled to the card controller, wherein the nonvolatile memory includes:
a plurality of memory banks;
a plurality of read global bit lines shared by the plurality of memory banks;
a plurality of write global bit lines shared by the plurality of memory banks, wherein each read global bit line of the plurality of read global bit lines and write global bit line of the plurality of write global bit lines that share a corresponding one of the plurality of memory banks are separate from one another;
a read circuit connected with the plurality of read global bit lines and configured to read data from memory cells in the plurality of memory banks through the plurality of read global bit lines;
a discharge control circuit connected with the plurality of write global bit lines, the discharge control circuit being configured either to cyclically discharge charges of the plurality of write global bit lines or to discharge charges of the plurality of write global bit lines during an initialization interval after a power-up operation;
a write circuit connected with the plurality of write global bit lines and configured to write data to the memory cells in the plurality of memory banks through the plurality of write global bit lines; and
a memory controller configured to control the read circuit, the discharge control circuit, and the write circuit.

19. The memory card of claim 18, wherein the discharge control circuit is configured to secondarily discharge the plurality of write global bit lines after a write command is input, said secondarily discharging not overlapping a develop interval of the read Operation.

20. The memory card of claim 18, wherein the plurality of write global bit lines are discharged during the initialization interval after the power-up operation and are cyclically discharged thereafter.

* * * * *